US 8,688,193 B2

(12) United States Patent
Doyle et al.

(10) Patent No.: US 8,688,193 B2
(45) Date of Patent: Apr. 1, 2014

(54) MAGNETIC RESONANCE IMAGER, METHOD AND PROGRAM WHICH CONTINUOUSLY APPLIES STEADY-STATE FREE PRECESSION TO K-SPACE

(75) Inventors: Mark Doyle, Wexford, PA (US); Robert Biederman, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 1064 days.

(21) Appl. No.: 12/215,098

(22) Filed: Jun. 26, 2008

(65) Prior Publication Data

US 2009/0326367 A1 Dec. 31, 2009

(51) Int. Cl.
*A61B 5/05* (2006.01)

(52) U.S. Cl.
USPC ............................................ 600/410; 600/407

(58) Field of Classification Search
USPC .......... 600/407, 410, 413; 324/300, 307, 309, 324/318, 322
See application file for complete search history.

(56) References Cited

U.S. PATENT DOCUMENTS

| | | |
|---|---|---|
| 4,310,799 A | 1/1982 | Hutchison et al. |
| 4,727,327 A | 2/1988 | Toyoshima et al. |
| 4,829,252 A | 5/1989 | Kaufman |
| 4,973,906 A | 11/1990 | Bernstein |
| 5,034,692 A | 7/1991 | Laub et al. |
| 5,160,889 A | 11/1992 | Scheidegger et al. |

(Continued)

FOREIGN PATENT DOCUMENTS

| | | |
|---|---|---|
| EP | 0430104 A2 | 6/1991 |
| EP | 0924530 A2 | 6/1999 |

(Continued)

OTHER PUBLICATIONS

Doyle et al. "Block Regional Interpolation Scheme for K-Space (BRISK): A Rapid Cardiac Imaging Technique" 1995, Magnetic Resonance in Medicine, Academic Press (Duluth, MN, US) 33:163-170.

(Continued)

*Primary Examiner* — Tse Chen
*Assistant Examiner* — Mark Remaly
(74) *Attorney, Agent, or Firm* — Fox Rothschild LLP (57) ABSTRACT

A magnetic resonance imager for forming images of a moving portion of a patient includes imaging coils. The imager includes a computer that causes the imaging coils to apply continuously steady-state free precession to k-space of a magnetic resonance image series of the patient and acquire the image series, and generates images from the image series. A method for forming images of a moving portion of a patient includes the steps of applying continuously steady-state free precession to k-space of a magnetic resonance image series of a patient. There is the step of acquiring the image series. There is the step of generating images from the image series. A method for forming images of a patient includes the steps of triggering a steady-state free precision imaging sequence to an ECG r wave of cardiac cycles of the patient. There is the step of performing the steady-state free precision imaging sequence with imaging coils of a magnetic resonance imaging scanner such that data for a series of k-space data sets associated with the imaging sequence are acquired in a manner that is time resolved through the cardiac cycle, with data acquired over a number of consecutive cardiac cycles. A computer program embodied on a computer readable medium to form an image of a patient with an MRI.

12 Claims, 8 Drawing Sheets

(56) References Cited

U.S. PATENT DOCUMENTS

| | | | |
|---|---|---|---|
| 5,204,627 A | 4/1993 | Mistretta et al. | |
| 5,305,749 A | 4/1994 | Li et al. | |
| 5,417,213 A | 5/1995 | Prince | |
| 5,525,904 A | 6/1996 | Hanley et al. | |
| 5,668,474 A | 9/1997 | Heid | |
| 5,713,358 A | 2/1998 | Mistretta et al. | |
| 5,910,728 A | 6/1999 | Sodickson | |
| 6,088,611 A | 7/2000 | Lauterbur et al. | |
| 6,233,475 B1 | 5/2001 | Kim et al. | |
| 6,259,940 B1 | 7/2001 | Bernstein et al. | |
| 6,275,037 B1 | 8/2001 | Harvey et al. | |
| 6,307,368 B1 | 10/2001 | Vasanawala et al. | |
| 6,310,478 B1 | 10/2001 | Heid | |
| 6,487,435 B2 | 11/2002 | Mistretta et al. | |
| 6,611,701 B2 * | 8/2003 | Foo | 600/413 |
| 6,630,828 B1 | 10/2003 | Mistretta et al. | |
| 6,694,166 B2 * | 2/2004 | Salome et al. | 600/410 |
| 6,771,067 B2 | 8/2004 | Kellman et al. | |
| 6,794,867 B1 | 9/2004 | Block et al. | |
| 6,975,115 B1 | 12/2005 | Fujita et al. | |
| 7,005,853 B2 | 2/2006 | Tsao et al. | |
| 7,020,509 B2 | 3/2006 | Heid | |
| 7,023,207 B1 | 4/2006 | Gaddipati et al. | |
| 7,046,003 B2 * | 5/2006 | Hargreaves et al. | 324/307 |
| 7,202,663 B2 | 4/2007 | Huang | |
| 7,245,125 B2 | 7/2007 | Harer et al. | |
| 7,253,620 B1 | 8/2007 | Derbyshire et al. | |
| 7,486,074 B2 | 2/2009 | McKenzie et al. | |
| 7,541,808 B2 | 6/2009 | Doyle | |
| 7,683,614 B2 | 3/2010 | Posse | |
| 7,693,563 B2 | 4/2010 | Suresh et al. | |
| 2003/0166999 A1 | 9/2003 | Liu et al. | |
| 2003/0169043 A1 | 9/2003 | Hoshino | |
| 2004/0051529 A1 | 3/2004 | Zhu et al. | |
| 2004/0254447 A1 | 12/2004 | Block et al. | |
| 2005/0007112 A1 | 1/2005 | Deimling | |
| 2005/0251023 A1 | 11/2005 | Kannengiesser et al. | |
| 2006/0036154 A1 | 2/2006 | Deimling | |
| 2006/0050981 A1 | 3/2006 | Huang | |
| 2006/0208730 A1 * | 9/2006 | Kozerke et al. | 324/307 |
| 2007/0063701 A1 | 3/2007 | Vu | |
| 2007/0110290 A1 | 5/2007 | Chang et al. | |
| 2007/0159174 A1 | 7/2007 | Oshio | |
| 2007/0242866 A1 | 10/2007 | Schmitt et al. | |
| 2008/0021304 A1 | 1/2008 | Stemmer | |
| 2008/0175458 A1 | 7/2008 | Guo et al. | |
| 2009/0105582 A1 | 4/2009 | Dougherty et al. | |

FOREIGN PATENT DOCUMENTS

| | | |
|---|---|---|
| GB | 2034123 A | 5/1980 |
| JP | 06 237910 A | 8/1994 |
| WO | WO 90/02344 | 3/1990 |
| WO | WO 90/12329 | 10/1990 |
| WO | WO 91/13367 A | 9/1991 |
| WO | WO 94/29741 A1 | 12/1994 |
| WO | WO 2006/120583 A | 11/2006 |

OTHER PUBLICATIONS

Geier et al "Parallel Acquisition for Effective Density Weighted Imaging: PLANED Imaging" 2007, Magnetic Resonance Materials in Physics, Biology and Medicine, Chapman and Hall (London, GB) 20 1:19-25).

Kozerke et al. "Accelerating Cardiac Cine 3D Imaging Using k-t BLAST" 2004, Magnetic Resonance in Medicine, Wiley-Liss, Inc, 52:19-26.

Lethmate et al. "Dynamic MR-Imaging with Radial Scanning, a Post-Acquisition Keyhole Approach" 2003, EURASIP J. on app. Signal Processing, Hindawi Publishing Corp. p. 405-412.

Pipe "Reconstructing MR Images From Undersamples Data: Data-Weighting Considerations" 2000, Magnetic Resonance in Medicine, Academic Press (Duluth, MN, US) 43(6):867-875.

Rehwald et al. "Theory of High-Speed MR Imaging o the Human Heart with the Selective Line Acquisition Mode" 2001, Radiology 220(2):540-547.

Tsai et al. "Reduced Aliasing Artifacts using Variable-Density k-Space Sampling Trajectories" 2000, Magnetic Resonance in Medicine, Academic Press (Duluth, MN, US) 43(3):452-458.

Tsao et al, "Eight-fold acceleration in real-time cardiac imaging using k-t BLAST and k-t SENSE with SSFP and segmented EPI" 2003, Proc, Intl. soc. Mag. Reson. Med. 11:209.

Tsao et al. "k-t BLAST and k-t SENSE: Dynamic MRI With High Frame Rate Exploiting Spatiotemporal Correlations" 2003, Magnetic Resonance in Medicine, Wiley-Liss, Inc, 50(5):1031-1042.

Goldfarb "Targeted Rotational Magnetic Resonance Angiography (TROTA): 2D Projection Imaging with 3D Reconstruction" 2004, Proceedings of the International Society for Magnetic Resonance in Medicine, 12th Scientific Meeting and Exhibition (Kyoto, JP) 11:2109.

Gurr et al. "Polar Phase Encode Placement for 3D Acquisition with time-resolved projections" 2003. Proceedings of the International Society for Magnetic Resonance in Medicine, 11th Scientific Meeting and Exhibition (Toronto, Canada 11:1349.

Lin et al. "Blood Attenuation with SSFP-Compatible Saturation (BASS)" 2006: Journal of Magnetic Resonance Imaging, Society for Magnetic Resonance Imaging (Oak Brook, IL, US) 24:701-707.

Uribe et al. "Integration of Magnetization Preparation Sequences into SSFP Sequences: A Fat Saturation Example" 2008, Proceedings of the International Society for Magnetic Resonance in Medicine, 16th Scientific Meeting and Exhibition (Toronto, Canada) p. 1402.

Werner et al. "Continuous Artery-Selective Spin Labeling (CASSL)" 2005, Magnetic Resonance in Medicine, Academic Press (Duluth, MN, US) 53:1006-1012.

Griswold et al. "Autocalibrated coil sensitivity estimation for parallel imaging" 2006, NMR in Biomedicine, Wiley (London, GB) 19:316-324.

Kellman et al. "Adaptive Sensitivity Encoding Incorporating Temporal Filtering (TSENSE)" 2001. Magnetic Resonance in Medicine, Academic Press (Duluth, MN, USA) 45(5):846-852.

Song et al, "Dynamic MRI with projection reconstruction and KWIC processing for simultaneous high spatial and temporal resolution" 2004, Magnetic Resonance in Medicine, Academic Press (Duluth, MN, US) 52(4):815-824.

Maier et al, "Accurate Velocity Mapping with FAcE" 1996, Magnetic Resonance Imaging, Elsevier Science, Inc. (USA) 14(2):163-171.

Witschey WR et al, "Balanced steady-state free precession spatial gridding", Proceedings of the International Society for Magnetic Resonance in Medicine, 16th Scientific Meeting and Exhibition, Toronto, Canada, May 3-9, 2008, p. 1404, XP002548175.

Pai VM: "PTAGs: Partial k-space tagging combined with SSFP" Proceedings of the International Society for MAgnetic Resonance in Medicine, 14th Scientific Meeting and Exhibition, Seattle, Washington, USA, May 6-12, 2006, p. 1216, XP002548176.

Herzka DA et al: "Multishot EPI-SSFP in the heart" Magnetic Resonance in Medicine, Academic Press, Duluth, MN, US, vol. 47, No. 4, Apr. 1, 2002, pp. 655-664, XP002526274, ISSN: 0740-3194.

Herzka DA et al: "Myocardial tagging with SSFP", Magnetic Resonance in Medicine, Academic Press, Duluth, MN, US, vol. 49, 2003, pp. 329-340, XP002548177.

Stainsby JA et al: "Visualizing flow using MR tagging and FIESTA imaging", Proceedings of the International Society for Magnetic Resonance in Medicine, 13th Scientific Meeting and Exhibition, Miami Beach, Florida, USA, May 7-13, 2005, p. 2382, XP002548178.

* cited by examiner

MAGNETIC RESONANCE IMAGER, METHOD AND PROGRAM WHICH CONTINUOUSLY APPLIES STEADY-STATE FREE PRECESSION TO K-SPACE

FIELD OF THE INVENTION

The present invention is related to forming imaging of a moving portion of a patient. (As used herein, references to the "present invention" or "invention" relate to exemplary embodiments and not necessarily to every embodiment encompassed by the appended claims.) More specifically, the present invention is related to forming imaging of a moving portion of a patient using steady-state free precession (SSFP) and a tag pattern in regard to k-space of a magnetic resonance imager.

BACKGROUND OF THE INVENTION

This section is intended to introduce the reader to various aspects of the art that may be related to various aspects of the present invention. The following discussion is intended to provide information to facilitate a better understanding of the present invention. Accordingly, it should be understood that statements in the following discussion are to be read in this light, and not as admissions of prior art.

Others have applied tagging to SSFP imaging, and in these instances the applied tags required using additional RF pulses and interrupting the regular SSFP RF train using an approach to store magnetization along the longitudinal axis. Also, conventionally full echo read outs are used. Previously, the Common k-space approach to tagging in which horizontal and vertical tag patterns were applied during separate cardiac cycles was described. In this approach, it was noted that there was a SNR improvement in applying separate stripe patterns compared to applying two sets of stripe tags to produce a grid tag pattern. However, due to the full echo acquisition of each signal read out, Common k-space could not be applied to tags at 45° without extending the scan time to 200% of the conventional scan time. Thus as described, Common k-space was only applicable to acquire vertical and horizontal tag lines. One major advantage of acquiring tags at 45° compared to 90° is that in k-space corresponding "satellite" tag signals are about 30% (i.e. √2) closer to the central k-space line. The advantage of this is that a lower resolution k-space matrix can acquire proportionately more tag information in less time, producing superior tag definition compared to a corresponding 900 grid tag series. Also, in Common k-space, while it was noted that the central region of k-space need only be acquired during either the horizontal or during the vertical tag section, this region was acquired at reduced intensity compared to a non-tag scan. In the current invention—called PRESSTO (Partial Recalled Echo in Steady-State Tag Ordering), 45° tags are allowed, and the central region is acquired without any tags applied. Further, PRESSTO could be applied to acquired tags at 0° and 90°, as in common k-space, and in this case the major differences between the previously described common k-space and PRESSTO are: 1) PRESSTO additionally targets the middle region of k-space, which is acquired without any tags applied, 2) the Common k-space approach was applied to gradient echo imaging whereas PRESSTO is applied to SSFP imaging, 3) in Common k-space whole lines of k-space were acquired for each TR period, whereas in PRESSTO partial lines are acquired, 4) in Common k-space only one line of k-space was acquired per TR period and in PRESSTO two line segments are acquired per TR period.

The previously described FastHARP approach uses a multi-echo gradient echo approach (a multi-pass echo planar imaging approach) to acquired regions of k-space corresponding to specific tag information. In Fast-HARP, which is described in terms of gradient echo imaging, only one tag direction is produced per cycle, and only one region is targeted for acquisition, centered on the satellite region of k-space. A grid tag is produced by combining the two acquisitions, each acquired with one set of tag lines, with the each tag series being orthogonal to each other. In this respect FastHARP has similarities with Common k-space in that only one tag producing series is generated for each pass and it has a similarity with PRESSTO in that a partial region of k-space is targeted for each acquisition. The major differences between FastHARP and PRESSTO are: 1) Fast-HARP is described for a gradient echo signal whereas PRESSTO is applicable to SSFP signals, 2) FastHARP targets the major tag-defining satellite signal region of k-space whereas PRESSTO targets a larger region containing several signal satellites, 2) FastHARP does not acquire the central region of k-space whereas PRESSTO targets this region with a non-tagged acquisition.

Thus, while there are similarities with previously described approaches, no other approach realized the acquisition characteristics for PRESSTO. The Table summarises the similarities and differences between PRESSTO, Common k-space, and FastHARP.

| PRESSTO | FastHARP | Common k-space |
|---|---|---|
| Steady state free precession imaging sequence | EPI imaging sequence, based on gradient recalled echo | gradient recalled echo imaging sequence |
| Multiple partial echo read outs | Multiple partial echo read outs | Single full line echo read out |
| New approach to tag generation* | Conventional tag generation | Conventional tag generation |
| Specifically targets center of k-space without tag information* | Center of k-space not targeted for acquisition | Center of k-space acquired as by-product of tag generation |
| Approximately 90% of k-space acquired | Approximately 10% of k-space acquired | All of k-space acquired |
| Applicable to 45° or 90° tags | Applicable to 45° or 90° tags | Applicable to 90° tags without time penalty, and to 45° with a time penalty of doubling the scan time |

-continued

| PRESSTO | FastHARP | Common k-space |
|---|---|---|
| Sensitive to multiple tag-defining satellite signals along each major axis | Sensitive to only the major tag-defining satellite signal along each major axis | Sensitive to multiple tag-defining satellite signals along each major axis |

*indicates a unique feature of PRESSTO not used in any other technology. While PRESSTO has some overlap with FastHARP and Common k-space, no other approach has combined the features of PRESSTO in a SSFP tagging sequence, which as stated above, has fundamentally different conditions compared to GRE and EPI. The fundamental differences between SSFP, EPI and GRE place severe constraints on the imaging gradients in SSFP, which do not have to be met in the other two acquisitions. In SSFP, it is essential to keep the repetition time, TR, short (typically <4 ms) to avoid introducing significant artifact related to main field inhomogeneity effects. PRESSTO achieves the conditions required for SSFP imaging, while reducing the TR by at least 10%.

The main problem that the present invention solves is fading of grid tag lines as the cycle progresses in magnetic resonance imaging of the heart. In conventional approaches to tagging, the grid tag lines are applied at the ECG r wave, i.e. at the start of systolic contraction, and contrast of grid tag lines is generally acceptable throughout the systolic period. As the cardiac cycle progresses, the contrast-to-noise ratio (CNR) of the grid tag lines steadily deteriorates, such that during the diastolic period, the CNR of the grid tag lines is generally too poor to allow adequate tracking of diastolic recovery of the heart. The current invention addresses this problem in several ways: 1) In PRESSTO, Steady state free precession (SSFP) imaging is used instead of the more common gradient echo imaging. Since the CNR in SSFP imaging is superior compared to gradient echo imaging, the CNR is inherently higher. 2) Conventionally, one grid tag pattern is initially applied (e.g. at 45 degrees) and is immediately followed by a set of stripe tags oriented at an orthogonal angle (e.g. at −45 degrees). In this case, the two sets of stripe patterns destructively interfere with each other to further degrade the grid tag CNR. Further, by applying two sets of stripe tags in this manner, the grid tag pattern is applied over an extended time period (e.g. the time it takes to apply two stripe tag patterns may occupy 15 ms per stripe series, for a total time of 30 ms). In PRESSTO, at most one set of stripe tags is applied during any given cardiac cycle. This avoids the loss of CNR by destructive interference between stripe tags and reduces the grid tag application time to that of a single stripe tag application (e.g. about 5 ms in PRESSTO). 3) In conventional gradient echo based approaches, stripe tags are applied by a combination of multiple RF pulses (typically 3-5) with interspersed gradients. To apply this approach to SSFP imaging requires interrupting the SSFP sequence and temporarily "storing" the steady state signal while the tags are applied. This interruption to the steady state typically results in residual spurious signal that disrupt the following few lines of k-space, making this early data following application of the tag pattern un-useable. In PRESSTO, no disruption is required of the train of continuously applied RF pulses required to sustain the SSFP signal, and consequently no compensation or discarding of k-space data is required. Further, in PRESSTO, compared to the SSFP sequence, no additional RF pulses are required to apply the tag pattern; instead, a non-balanced gradient is applied. 4) In conventional grid tagging, typically, each lines of k-space is acquired in its entirety, which, due to the concentration of signal inherent in tagging, means that substantial regions of primarily noise data are acquired along with the smaller regions of useful signal data, resulting in an overall reduction of the CNR. In PRESSTO, in each acquisition only partial k-lines are acquired, targeted to where the primary data are expected, thereby further increasing the CNR. 5) In conventionally tagging, even if only a stripe tag pattern is acquired, the central region of k-space, which corresponds to the baseline image upon which tags are superimposed, suffers low CNR due to signal interference between this region and the tag pattern. In PRESSTO, the central region is specifically acquired without any tag pattern applied, and it is therefore acquired at the optimal CNR. 6) Alternative approaches that separately acquire two stripe tag data sets typically double the scan time compared to the standard grid tag data set. In PRESSTO, k-space is split into three regions, corresponding to two sets of orthogonal stripe tags and one central region without tags, and since each region is primarily targeted for acquisition using a partial k-space line signal readout, the scan time in PRESSTO is not extended beyond that of a single stripe tag acquisition scan.

All of these features of PRESSTO contribute to the superior CNR and overall short scan time, allowing it to be performed in a breathhold manner.

BRIEF SUMMARY OF THE INVENTION

The present invention pertains to a magnetic resonance imager for forming images of a moving portion of a patient. The imager comprises imaging coils. The imager comprises a computer that causes the imaging coils to apply continuously steady-state free precession to k-space of a magnetic resonance image series of the patient and acquire the image series, and generates images from the image series.

The present invention pertains to a method for forming images of a moving portion of a patient. The method comprises the steps of applying continuously steady-state free precession to k-space of a magnetic resonance image series of a patient. There is the step of acquiring the image series. There is the step of generating images from the image series.

The present invention pertains to a method for forming images of a patient. The method comprises the steps of triggering a steady-state free precision imaging sequence to an ECG r wave of cardiac cycles of the patient. There is the step of performing the steady-state free precision imaging sequence with imaging coils of a magnetic resonance imaging scanner such that data for a series of k-space data sets associated with the imaging sequence are acquired in a manner that is time resolved through the cardiac cycle, with data acquired over a number of consecutive cardiac cycles.

The present invention pertains to a computer program embodied on a computer readable medium to form an image of a patient with an MRI comprising the computer generated steps of producing RF pulses and gradients with imaging coils. There is the step of causing the imaging coils to apply continuously steady-state free precession to k-space of a magnetic resonance image series of the patient and acquire the image series, and generate images from the image series.

BRIEF DESCRIPTION OF THE SEVERAL VIEWS OF THE DRAWING

In the accompanying drawings, the preferred embodiment of the invention and preferred methods of practicing the invention are illustrated in which:

FIGS. 1a-1d, the k-space (FIGS. 1a and 1b) and corresponding tag patterns (FIGS. 1c and 1d) are shown for two cases: FIG. 1a shows conditions for two sets of tag lines at 45° to the image axis (FIG. 1c), and FIG. 1b shows conditions for two sets of tag lines at 90° to the image axis (FIG. 1d).

FIGS. 3a-3d, the k-space signal pattern (FIGS. 3a and 3b) and corresponding image tag pattern (FIGS. 3c and 3d) are shown for two cases: FIGS. 3a and 3c shows conditions for two sets of tag lines at −45° to the image axis, and FIGS. 3b and 3d shows conditions for two sets of tag lines at 45° to the image axis.

FIGS. 4a-4d, the central k-space signal (FIGS. 4a and 4b) and corresponding image (FIGS. 4c and 4d) are shown for two cases: FIGS. 4a and 4c without tags applied and FIGS. 4b and 4d, with tags applied.

DETAILED DESCRIPTION OF THE INVENTION

Figure 12:
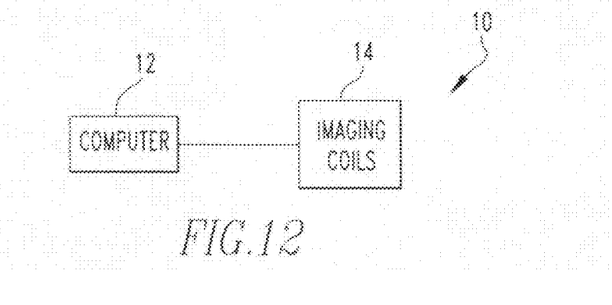
FIG. 12 is a block diagram of an imager of the present invention.

Referring now to the drawings wherein like reference numerals refer to similar or identical parts throughout the several views, and more specifically to FIG. 12 thereof, there is shown a magnetic resonance imager 10 for forming images of a moving portion of a patient. The imager 10 comprises imaging coils 14. The imager 10 comprises a computer 12 that causes the imaging coils 14 to apply continuously steady-state free precession to k-space of a magnetic resonance image series of the patient and acquire the image series, and generates images from the image series.

Preferably, the computer 12 causes the imaging coils 14 to apply a tag pattern to a motion cycle of the image series. The computer 12 preferably causes the imaging coils 14 to acquire the image series which shows the tag pattern deforming.

Preferably, wherein the computer 12 causes the imaging coils 14 to apply taglines in only one direction or no taglines during the cycle. The computer 12 preferably causes the imaging coils 14 to apply taglines to only predetermine regions of k-space which together are less than all of k-space.

Preferably, the computer 12 causes the imaging coils 14 to acquire only the tag lines applied to the predetermined regions. The computer 12 preferably sums data from the regions of k-space which overlap. Preferably, the computer 12 causes the imaging coils 14 to insert a gradient of non-zero area between two contiguous RF pulses during the application of steady-state free precession. The computer 12 preferably causes the imaging coils 14 to applying tag generating gradients at a desired point in the motion cycle.

Preferably, the computer 12 causes the imaging coils 14 to apply taglines in only one direction or no taglines during each cycle of a plurality of cycles. The computer 12 preferably causes the imaging coils 14 to apply gradients associated with echo acquisitions segments of the cycle. Preferably, the computer 12 causes the imaging coils 14 to sample the regions associated with the taglines or no taglines using a desired combination of echo acquisitions. The computer 12 preferably causes the imaging coils 14 to combine separate signals from each sample by addition into a single matrix. Preferably, the computer 12 causes the imaging coils 14 to generate images with a 2 D Fourier transform.

The present invention pertains to a method for forming images of a moving portion of a patient. The method comprises the steps of applying continuously steady-state free precession to k-space of a magnetic resonance image series of a patient. There is the step of acquiring the image series. There is the step of generating images from the image series.

Preferably, the applying step includes the step of applying a tag pattern to a motion cycle of the image series. The acquiring step preferably includes the step of acquiring the image series which shows the tag pattern deforming. Preferably, the applying step includes the step of applying taglines in only one direction or no taglines during the cycle. The applying step preferably includes the step of applying taglines to only predetermine regions of k-space which together are less than all of k-space. Preferably, the acquiring step includes the step of acquiring only the tag lines applied to the predetermined regions. The acquiring step preferably includes the step of summing data from the regions of k-space which overlap. Preferably, the step of applying taglines includes the step of inserting a gradient of non-zero area between two contiguous RF pulses during the application of steady-state free precession.

The applying step preferably includes the step of applying tag generating gradients at a desired point in the motion cycle. Preferably, the acquiring step includes the step of applying taglines in only one direction or no taglines during each cycle of a plurality of cycles. The applying step preferably includes the step of applying gradients associated with echo acquisitions segments of the cycle. Preferably, the acquiring step includes the step of sampling the regions associated with the taglines or no taglines using a desired combination of echo acquisitions. The acquiring step preferably includes the step of combining separate signals from each sample by addition into a single matrix. Preferably, the generating image step includes the step of generating images with a 2 D Fourier transform.

The present invention pertains to a method for forming images of a patient. The method comprises the steps of triggering a steady-state free precision imaging sequence to an ECG r wave of cardiac cycles of the patient. There is the step of performing the steady-state free precision imaging sequence with imaging coils 14 of a magnetic resonance imaging scanner such that data for a series of k-space data sets associated with the imaging sequence are acquired in a manner that is time resolved through the cardiac cycle, with data acquired over a number of consecutive cardiac cycles.

Preferably, there is the step of applying one of a plurality of distinct signal patterns with the imaging gradients to the patient immediately following detection of the ECG trigger. The applying step preferably includes the step of applying a first striped tag pattern along one axis. Preferably, the applying step includes the step of applying a second striped tag pattern along an orthogonal axis to the one axis. The applying step preferably includes the step of applying no tag pattern.

Preferably, each step of applying a striped tag pattern includes the step of applying a gradient waveform with a non-zero area of the steady-state free precision imaging sequence. The step of applying a gradient waveform preferably includes the step of applying the gradient waveform perpendicular to a direction of the striped tag pattern.

Preferably, the step of applying no tag pattern includes the step of applying a gradient waveform with an area balanced to zero. There is preferably the step of the first striped tag pattern and the second striped tag pattern and the no tag pattern each producing signals in distinct and predictable regions of k-space from each other.

Preferably, there are the steps of the first and second striped tag patterns producing data primarily in two diagonally opposing quadrants of k-space, and the no tag pattern producing data primarily centered on a center of K-space. There is preferably the step of sampling three separate regions of the k-space with the imaging coils 14. Preferably, there are the steps of initially setting all k-space points to zero, and sequentially adding in data for each k-space region acquired using a summing operation. There are preferably the steps of summing data where points of the region overlap, summing data from zero where points do not overlap, and maintaining a k-space point at zero where no data are acquired. Preferably, the one axis is about 45° to a main axis, and the orthogonal axis is about −45° to the main axis.

The present invention pertains to a computer 12 program embodied on a computer 12 readable medium to form an image of a patient with an MRI comprising the computer 12 generated steps of producing RF pulses and gradients with imaging coils 14. There is the step of causing the imaging coils 14 to apply continuously steady-state free precession to k-space of a magnetic resonance image series of the patient and acquire the image series, and generate images from the image series.

Static magnetic field, with imaging gradients and radio frequency pulses that are applied with emitting coils 14 to obtain kspace data. Detector coils 14 and digitizing system convert the electrical voltage information into digital values. These values are stored in arrays within the imager 10 computer 12 memory along with the information relating to the timing within the cardiac cycle and the tagging conditions that pertain to the acquired data. The gradient strengths are altered to obtain data for each region of kspace. When data acquisition is completed, the kspace data are arranged in the manner required by PRESSTO and processed into a time-resolved image serious of tagged data.

In the operation of the invention, a line or grid tag pattern is applied to a magnetic resonance image series, such as a cardiac image series, at one point in the cycle and the image series is acquired, to shows the tag pattern deforming. While line and grid tagging have been previously described (FIG. 1), there are several aspects in this invention that are combined in one approach, that lead to new capabilities and features compared to previous approaches: 1) Whereas the majority of tag approaches have been applied using gradient recalled echo imaging, this invention is applicable for the steady state free presession (SSFP) approach. Since the SSFP sequence is inherently signal rich, a high signal to noise ratio (SNR) image series is generated. The SSFP approach is fundamentally different compared to gradient recalled echo (GRE) approaches, including the rapid echo planar imaging (EPI) approach. In GRE approaches the phase of the spin system is generally left in a dephased condition at the end of each separate application of the imaging sequence. In SSFP imaging, the spin system must be rephased to allow all spins to contribute to the subsequent image. This rephasing requirement places additional conditions on the gradients, such that the cumulative area mapped out by the gradients is zero. 2) The tag pattern is applied in a manner that utilizes the inherent radio frequency (RF) pulse sequence in use for SSFP imaging, i.e. it does not require introduction of additional RF pulses that could disrupt the SSFP sequence. 3) A partial echo acquisition, specifically applicable to SSFP imaging is used, which was described in a previous invention, SWIFT, U.S. patent application Ser. No. 12/006,540, incorporated by reference herein. This partial echo acquisition is used in conjunction with the tag excitation pattern to efficiently acquire data with a high signal to noise ratio (SNR). Even though each line of k-space is split into several segments, the scan does not exceed a conventional scan time. Previously, in the SWIFT acquisition, an acceptable scan time for a time resolved image series was realized in part by employing sparse temporal sampling. Sparse temporal sampling is not generally applicable to tagged images because the signal is distributed more widely in k-space. Thus, efficient sampling and gradient design are required to maintain the scan time at acceptable levels (e.g. within a breath-hold for a patient scan). 4) The aspect of SWIFT that splits each line of k-space into several sections is used to acquire data at high SNR by exploiting the signal focusing aspect of the invention. Signal focusing is used to effectively increase the SNR in distinct regions of k-space, only when those regions are being sampled. This is achieved by splitting the tag application into three distinct operations, only one of which is applied for any given cycle: applying lines at 45°; applying lines at −45°; and not applying any tag lines. For any given region of k-space, only one of the tag application modes is operational. By this means, signal is not dispersed over all of k-space, but is effectively focused in certain regions, and these regions are targeted for acquisition using the partial echo acquisition. Further, by not applying tag features simultaneously (e.g. stripe patterns at 45° and 45° to impose a diamond grid pattern) there is no interference between signals that typically degrades the pattern where they overlap, such as at the corners of each tag.

The invention, PRESSTO, achieves a high SNR for the efficiently acquired tagged image series, overcoming the most significant problem of grid-tagging, i.e. tag fade over the cycle. Tag fade typically limits examination of the tag pattern to the early portion of the cycle (i.e. to systole in cardiac imaging). Tags fade over time due to several features 1) the inherent spin relaxation properties of the tissue being imaged (T1 relaxation), 2) the degree to which tag features interfere with each other, and 3) the inherent SNR of the scan, with higher SNR data sets being associated with lower tag fade (i.e. the tags can be discerned further into the cycle in scans with higher SNR).

The T1 relaxation of tissue is a fundamental limitation, with long T1s being preferable, and while the T1 can be reduced by introduction of a contrast agent, lengthening the T1 is not generally feasible (without increasing the main magnetic field strength). However, at typical magnetic field strengths used in commercial scanners (e.g. 1.5 to 3 T) the T1 of muscle is generally sufficient to give good tag persistence into the diastolic portion of the cardiac cycle, and the main problem of tag fade is related to the sequence dependant aspects. Interference between tag features is a major source of tag fade. Often, this is overcome by obtaining each tag stripe pattern in separate acquisitions thereby increasing the number of scans performed. In the current invention, three separate tag features are identified, only one of which is applied during any given cycle, and thus there is no interaction possible between these features. The aspect of the invention of providing good SNR is related to several features, including use of the signal rich SSFP sequence, the signal focusing achieved by splitting the tag pattern into separate regions of k-space, and providing a better "basis" image compared to conventional tag acquisitions, corresponding to the central region of k-space.

The invention comprises the following set of operations:

Tag Generation

Figure 2:
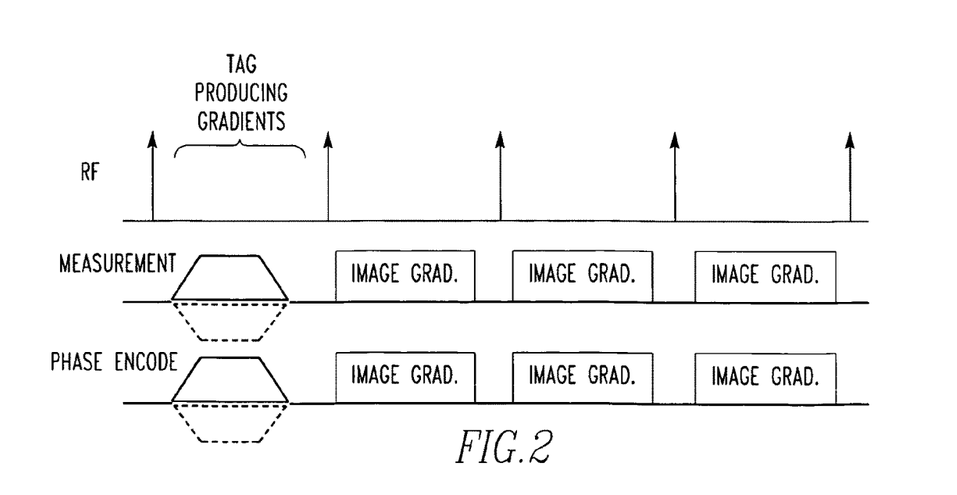
FIG. 2, tag and imaging gradients used in PRESSTO are indicated: the top panel indicates the RF pulses, applied at regular intervals corresponding to the TR of the sequence.

In SSFP imaging the key features are to keep the train of RF pulses uninterrupted, keeping the repletion time (TR) of the sequence short (e.g. 4 ms) to avoid signal disruption by phase dispersion as a result of inhomogeneities in the main magnetic field, and to balance any applied gradient areas to zero over each TR period. In PRESSTO, the 45° and −45° tag patterns are applied by using a gradient waveform that results in a non-zero area over the TR period (FIG. 2). By this means, the spins perpendicular to the applied gradient will experience a sinusoidal distribution of phase, cyclically going through zero degrees. At the time of the next RF pulse in the SSFP sequence, only spins that have close to zero phase will contribute to subsequent echo signals. Thus, by applying this non-zero gradient for one TR period, a stripe tag pattern will appear in data acquired during subsequent images acquired using the SSFP signal. Since the RF pulse angle used in SSFP imaging is typically in the range 45° to 60°, the non-contributing spins will only have been tipped towards the transverse plane by this angle. Ideally, spins should be tipped by 90°, i.e. into the transverse plane. To arrange conditions to closer approximate to this, the stripe tag generation procedure described above can be reinforced by repeating the tag generating gradient in a second or third contiguous TR period. By changing the orientation of the tag generating gradients, the orientation of the periodic stripe pattern can be changed. In PRESSTO, there are three patterns that contribute to the final grid tag: 1) 45° stripes (FIG. 3), 2) −45° stripes (FIG. 3), and 3) an untagged "basis" image (FIG. 4). In PRESSTO, only one of these distinct patterns is applied during any given cycle period (FIG. 5). The three distinct patterns generate signal primarily in three different regions of k-space: 1) the 45° stripes, generate a series of "satellite" signal concentrations, periodically arranged along the 45° axis (FIG. 3), 2) the −45° stripes generate a series of satellite signal concentrations, periodically arranged along the negative 45° axis (FIG. 3), and 3) the untagged basis image, which generates a signal concentration centered on the center of k-space (FIG. 4). By only applying one of these patterns in any given cycle, all the k-space signal is focused into these regions separately, thereby generating the signal focusing aspect of the invention. The central basis image forms the baseline image upon which the satellite tag signal operate, i.e. the central region of k-space forms an image without tag information, and when the satellite tag signals are present in k-space, they effectively impose the strip pattern on this basis image. In conventional grid tagging, whereby two sets of orthogonal stripes are applied, the signal available for the basis image is of a relatively low SNR nature. In PRESSTO, the basis image is composed of k-space data without any tags applied, consequently providing an improved image for the tag data to operate on.

Signal Acquisition

In PRESSTO signal acquisition is performed for three distinct regions of k-space: 1) early echo segment, 2) late echo segment, and 3) mid echo segment (FIG. 6). This is similar to the manner described in the SWIFT invention. The major difference in PRESSTO being that the early and late echo segments typically occupy a greater proportion of the signal echo than in SWIFT (in PRESSTO, early and late echo segments will occupy approximately 40% instead of 25%). As in SWIFT, two echo segments are read-out during each TR period. Further, in PRESSTO, the middle section occupies approximately 40% instead of the 50% used in SWIFT (U.S. patent application Ser. No. 12/006,540, incorporated by reference herein), and in PRESSTO, two middle echo segments are read out per TR period, whereas only one was read out in SWIFT. These three distinct echo segment read outs are used efficiently in PRESSTO to read out the tag data as follows: 1) When the 45° stripe pattern is applied, the early and late echo segments in diagonally opposite regions of k-space are sampled, such that the diagonally concentrated signal regions are sampled without sampling the central region of k-space (FIG. 7). If a conventional acquisition were used to read out of full echo signal corresponding to one line of k-space, then only one line could be acquired per TR. In PRESSTO, each quadrant where data sampling occurs is sampled for 40% of the lines in that quadrant. Thus, conventionally, acquisition of 40% of the two quadrants targeted would occupy a scan time of 80% of the conventional scan time. Since, at this point, the scan is not complete, the final scan would occupy approximately 200% of the conventional scan time. The three distinct read-gradient waveforms used to acquire early, late and middle echo segments are illustrated in FIG. 8. In PRESSTO, these gradient waveforms allow two lines segments to be acquired per TR period, and thus acquisition of these two quadrants only occupies 40% of a conventional scan time instead of 80%. 2) When the −45° stripe pattern is applied, the early and late echo segments in diagonally opposite regions of k-space are sampled, such that the diagonally concentrated signal regions are sampled without sampling the central region of k-space, FIG. 7. Similarly for the 45° pattern, acquisition of this tag signal occupies 40% of the conventional scan time in the complementary quadrants. 3) The third region to be sampled in PRESSTO is associated with the untagged image. Conventionally, this region contains a dramatically truncated signal due to interaction with the stripe or grid tags, it is centered at the center of k-space, and is typically acquired along with the line or grid tag series. In PRESSTO, the central region is treated and acquired separately. The central region is acquired using the middle echo read out acquisition, and when acquiring this region, no tag data is applied. Effectively, then, the middle section is a conventional, non-tagged data set. In PRESSTO, this region is sampled for about 40% of the number of k-space lines. Again, conventionally, sampling to this extent would occupy 40% of the full acquisition. In PRESSTO, since two line segments are acquired per TR period, this acquisition only occupies 20% of the conventional scan acquisition (FIG. 8). Thus, the net time to acquire all the targeted regions of k-space in PRESSTO occupies the same time as a conventional scan (i.e. 100%). Additionally, SSFP imaging sequences are very sensitive to off-resonance effects, which in practice requires a short TR to minimize these effects. By splitting up the acquisition of each echo into segment, the net TR is reduced by at least 10% compared to a corresponding conventional full echo scan. In the worked example here, the conventional TR would be 4 ms, and the TR for the PRESSTO scan would be 3.6 ms. Even this small decrease in TR would have an appreciable beneficial influence on the resulting images.

Signal Combination and Processing

In PRESSTO, some regions of k-space remain unsampled and some regions are sampled twice. The data for each region are acquired and stored in intermediate data arrays in the imaging system computer 12. Following the completed acquisition, a composite k-space matrix is constructed as follows: for each frame, starting with a matrix matched in size to the nominal scan size (e.g. 256×256) with zeros entered into each element, the data corresponding to each region of k-space are added to corresponding elements. Where only one sampling point occurs, this data is the only value present. Where no data sampling occurred, these values are left at level zero. Where data overlaps between two regions (e.g. the central and each tag-defining segment) the data are added, not averaged. Images are generated by performing a 2D Fourier transform on each frame of the series. It is possible that the central region of k-space has high signal at the edges of the sampled region. In this case, this data might generate Gibbs ringing artifacts in the final image. To alleviate this, a filter can be applied to gradually truncate the signal towards the edges of the sampled region. This would slightly blur the baseline image formed from the central k-space region, and remove ringing artifacts.

Figure 1A:
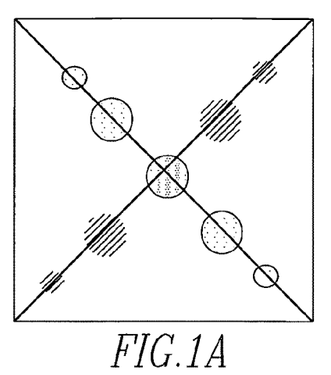
Figure 1B:
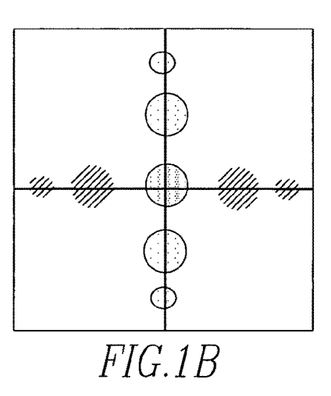
Figure 1C:
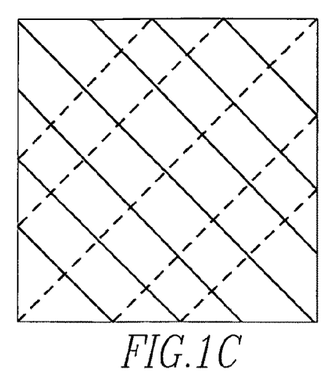
Figure 1D:
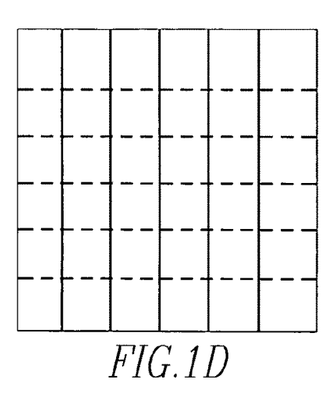

In FIGS. 1a-1d, the k-space (FIGS. 1a and 1b) and corresponding tag patterns (FIGS. 1c and 1d) are shown for two cases: FIG. 1a shows conditions for two sets of tag lines at 45° to the image axis (FIG. 1c), and FIG. 1b shows conditions for two sets of tag lines at 90° to the image axis (FIG. 1d). In the k-space representation, the central solid circle represents the central region of k-space, the solid gray circles are the signal "satellite" regions corresponding to the sold tag lines, and the hatched circles are the signal "satellite" regions corresponding to the dotted tag lines. Depending on the details of tag line density, at least one, and typically several concentrations of satellite k-space signals are present along each axis. The tag-defining off-center signal concentrations (i.e. "satellites") are distributed along the gray lines shown in the k-space representations.

In FIG. 2, tag and imaging gradients used in PRESSTO are indicated: the top panel indicates the RF pulses, applied at regular intervals corresponding to the TR of the sequence. The 45° and −45° tag gradients are indicated in the gradients in the lower two panels, representing the measurement and phase encoding gradients, respectively. The 45° tags applied by the gradients indicated by solid lines, and −45° tags applied by the gradients indicated by the dashed lines. The imaging gradients (Image Grad.) are different from the tag producing gradients, and are applied over the motion cycle (e.g. cardiac cycle) during each successive TR period. Details of the imaging gradients are illustrated in FIG. 8.

Figure 3A:
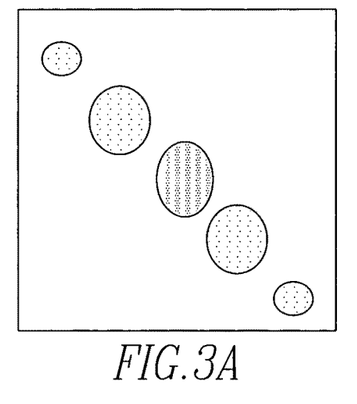
Figure 3B:
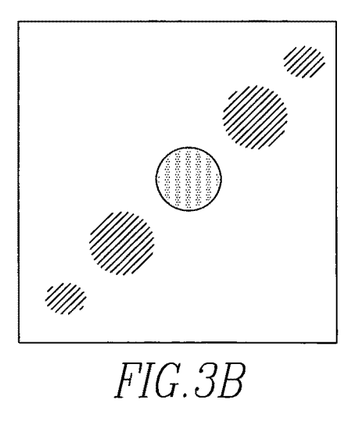
Figure 3C:
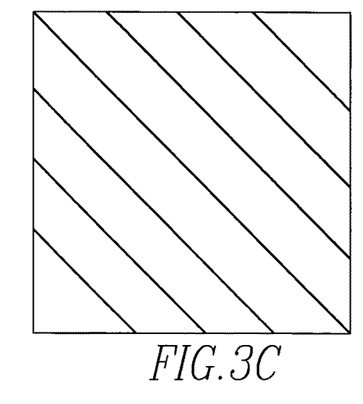
Figure 3D:
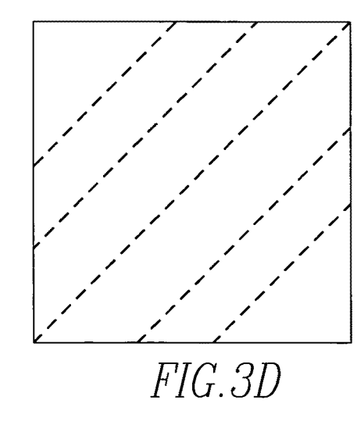

In FIGS. 3a-3d, the k-space signal pattern (FIGS. 3a and 3b) and corresponding image tag pattern (FIGS. 3c and 3d) are shown for two cases: FIGS. 3a and 3c shows conditions for two sets of tag lines at −45° to the image axis, and FIGS. 3b and 3d shows conditions for two sets of tag lines at 45° to the image axis. In the k-space representation, the central solid circle represents the central region of k-space; the solid gray circles are the signal regions corresponding to the sold tag lines, i.e. the so-called tag-defining "satellite" signals, since they "orbit" the central signal. Compared to the example of FIGS. 1a-1d, where two orthogonal tag patters were simultaneously applied, the signal here is only distributed between the central and one diagonal axis, instead of being distributed between two diagonal axes. This demonstrates the signal focusing aspect achieved by PRESSTO, i.e. by not dispersing the signal over two tag axes, the tag signal satellites have increased signal to noise ratio (SNR) compared to the grid tag applied directly. Note that the central signal, does not contribute to defining the tag pattern. Instead, this central region of k-space defines the so-called "basis image", i.e. an image without any tag pattern, that otherwise resembles a normal image. In PRESSTO, the central region is targeted for acquisition when no tags are applied, as indicated in FIGS. 4a-4d.

Figure 4A:
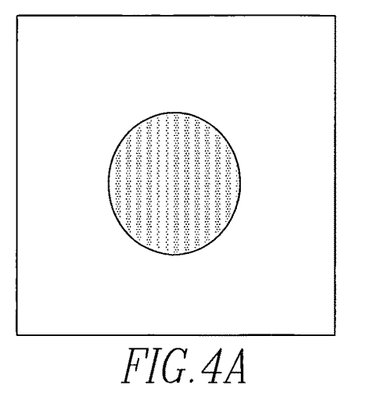
Figure 4B:
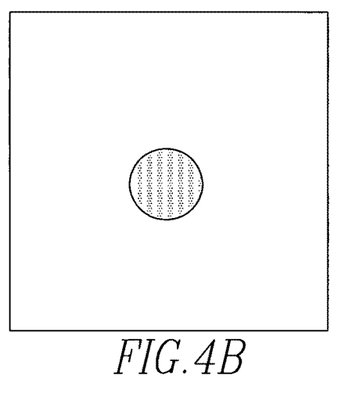
Figure 4C:
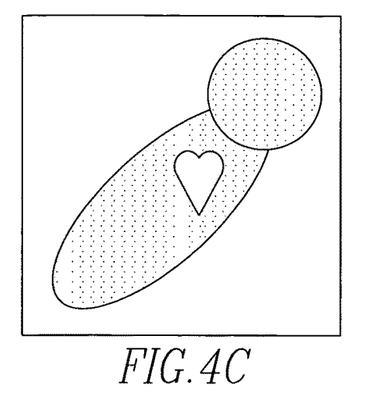
Figure 4D:
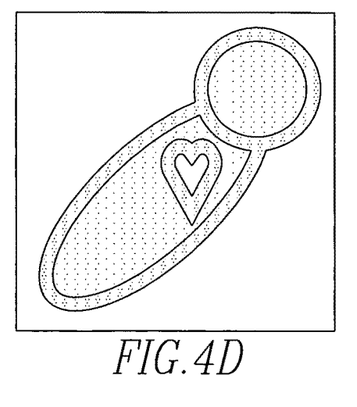
Figure 5:
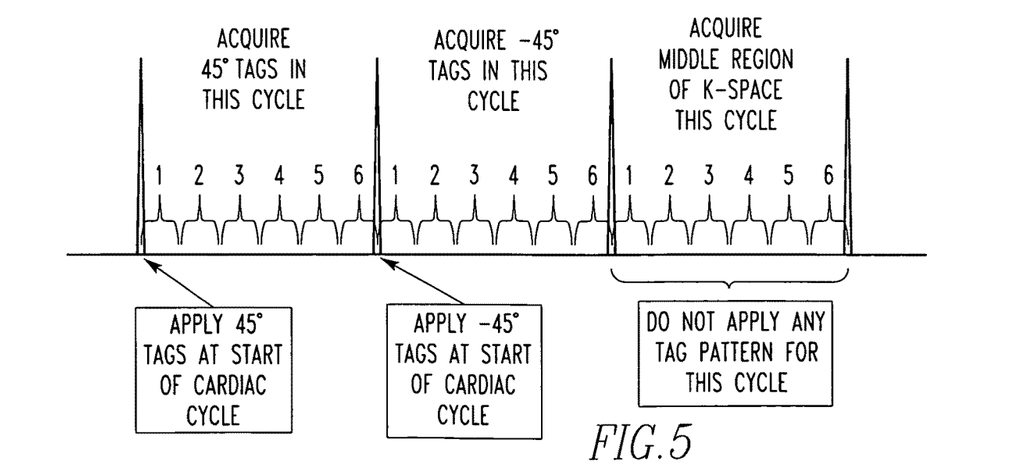
FIG. 5 shows, for cardiac imaging, application of the PRESSTO sequence is synchronized to the ECG cycle.

In FIGS. 4a-4d, the central k-space signal (FIGS. 4a and 4b) and corresponding image (FIGS. 4c and 4d) are shown for two cases: FIGS. 4a and 4c without tags applied and FIGS. 4b and 4d, with tags applied. In FIGS. 4b and 4d, where a tag pattern was applied, the "satellite" tag-defining signals in k-space have been removed, leaving only the central k-space signal. In this case with no tags applied (FIGS. 4a and 4c), no signal was distributed to the "satellite" signals in k-space, and consequently the central k-space region has a higher SNR than the case where tags were applied (FIGS. 4b and 4d), and some signal was distributed to the tag-defining satellites. The corresponding images formed by Fourier transforming the central k-space signals, indicate either sharp detail for the no-tag set, represented in the top panel by the distinct boundary lines, or low detail, for the tag set, represented in the lower pane by the thick gray boundary lines. Note that both of the image representations do not have any evidence of tag stripes or grids applied.

Referring to FIG. 5, for cardiac imaging, application of the PRESSTO sequence is synchronized to the ECG cycle. In this example, the 45° tag pattern is applied at the start of the first cycle, following detection of the R wave, and data are acquired corresponding to individual cardiac phases (6 in this example). In the second cardiac cycle, the −45° tag pattern is applied, and data acquired for individual cardiac phases. In the third cardiac cycle, no tag data are applied, and data acquired corresponding to the central region of k-space. This demonstrates the principle of only applying one distinct tag or no-tag pattern per motion cycle (cardiac cycle in this example). Typically, to acquire sufficient data to sample each k-space segment will require several cycles to complete the acquisition.

Figure 6A:
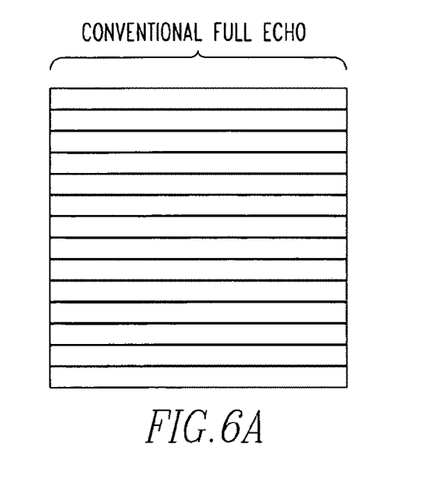
FIGS. 6a and 6b show the echo splitting aspect of PRESSTO
Figure 6B:
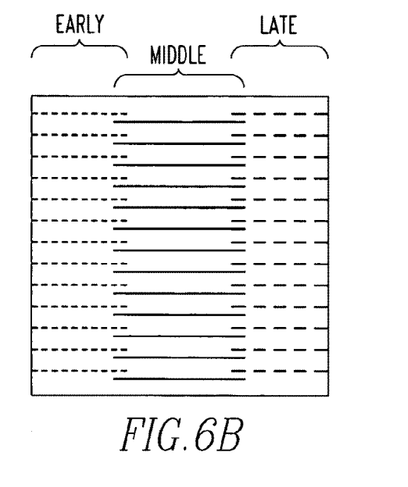

In FIGS. 6a and 6b, the echo splitting aspect of PRESSTO is illustrated. In FIG. 6a, a conventional k-space matrix is represented, in which each line of k-space is acquired as a single echo signal. In PRESSTO each line is split into three echo segments. In this example, the "early" (dotted line) and "late" (dashed line) segments of FIG. 6b each occupy 40% of the line, and the "middle" (solid line) section occupies 40% of the line. Since the early and middle and late and middle sections overlap, the middle section has been drawn slightly displaced to show this, but in practice, corresponding early, middle, and late echo sections are acquired for the same line.

Figure 7A:
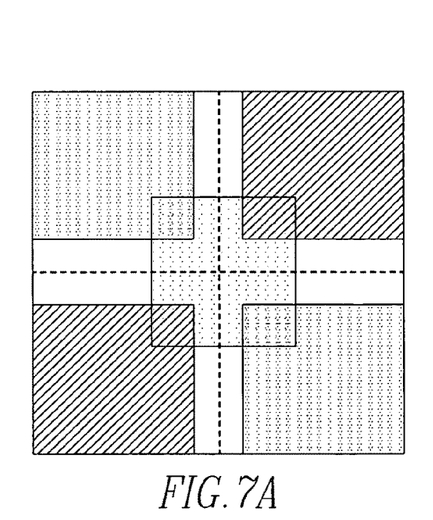
FIGS. 7a and 7b show, for PRESSTO, using diagonal tags, the signal sampling extent of k-space.
Figure 7B:
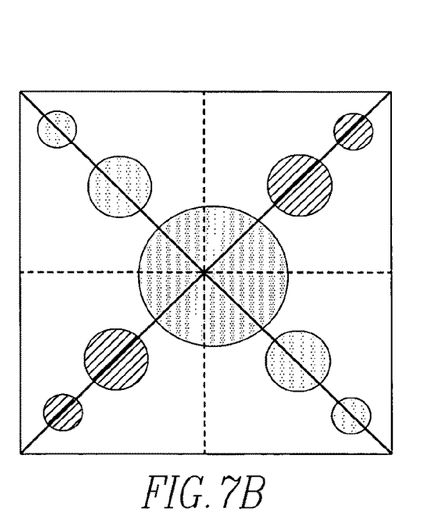
Figure 8:
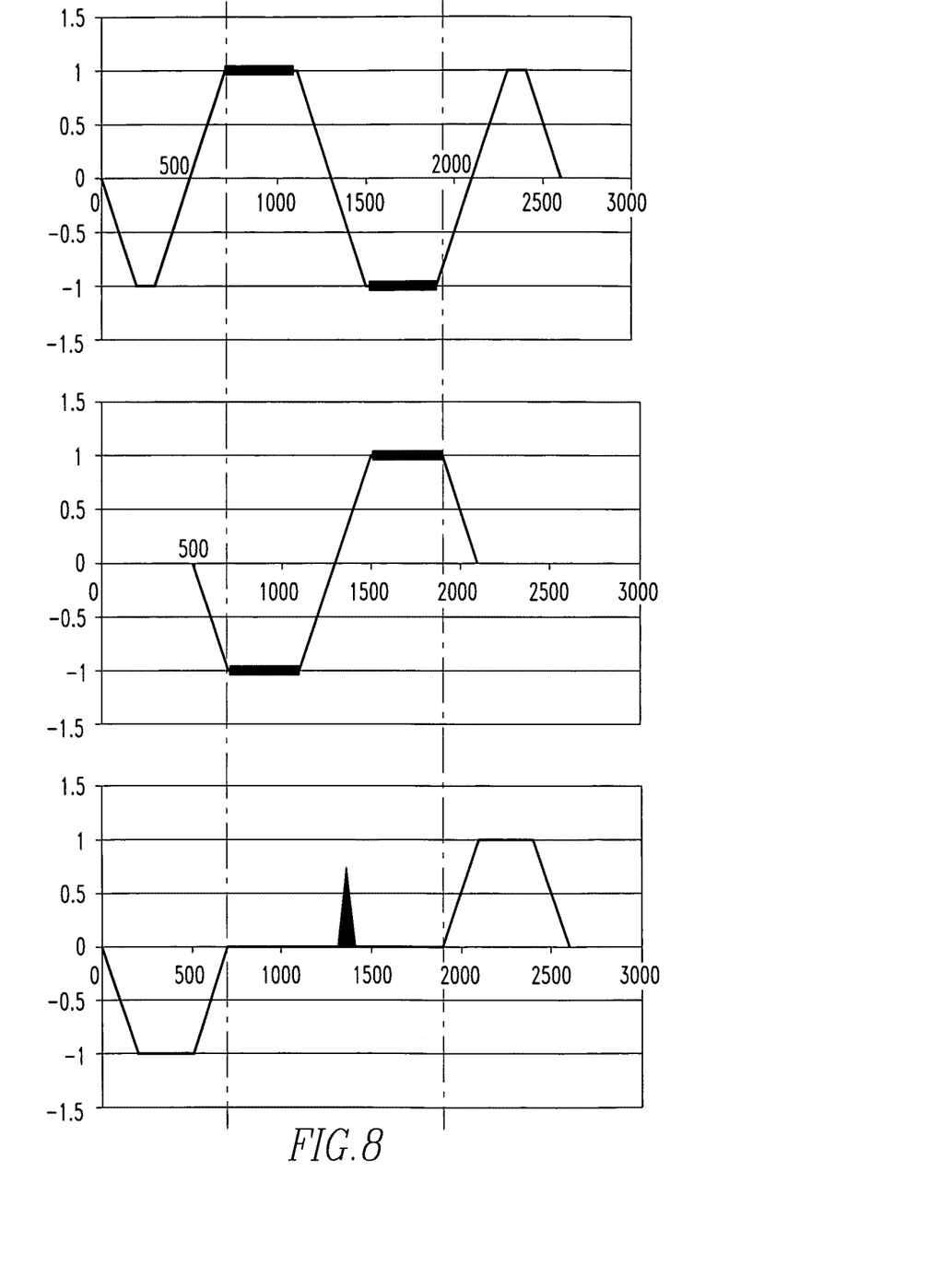
FIG. 8 shows the gradient waveforms used for PRESSTO imaging.

In FIGS. 7a and 7b, for PRESSTO, using diagonal tags, the signal sampling extent of k-space is illustrated in FIG. 7a and the k-space signal pattern is shown in the FIG. 7b. In the k-space sampling scheme, the sold gray regions represent the early and late echo segments associated with one set of diagonal tag defining signals (solid gray circles in k-space representation). The hatched regions in the sampling scheme represent the early and late echo segments associated with the second set of diagonal tag defining signals (hatched circles in the k-space representation). Sampling of the central region is accomplished using the mid echo acquisition gradients, applied to sample the central region without any tag pattern applied.

In FIG. 8, the gradient waveforms used for PRESSTO imaging, the top panel shows the measurement gradient for the mid section, with thick gray lines indicating when data are sampled, the middle panel shows the measurement gradient for the early echo segment, with thick gray lines indicating when data are sampled, the corresponding late echo measurement gradient is not drawn, being similar to the early echo segment but with gradient polarities reversed, and the last panel shows the corresponding phase encoding gradient, drawn at the phase corresponding to the maximal phase encoded line. The vertical dashed lines indicate that data sampling is accomplished in the period when the phase encoding gradient is not applied.

Figure 9:
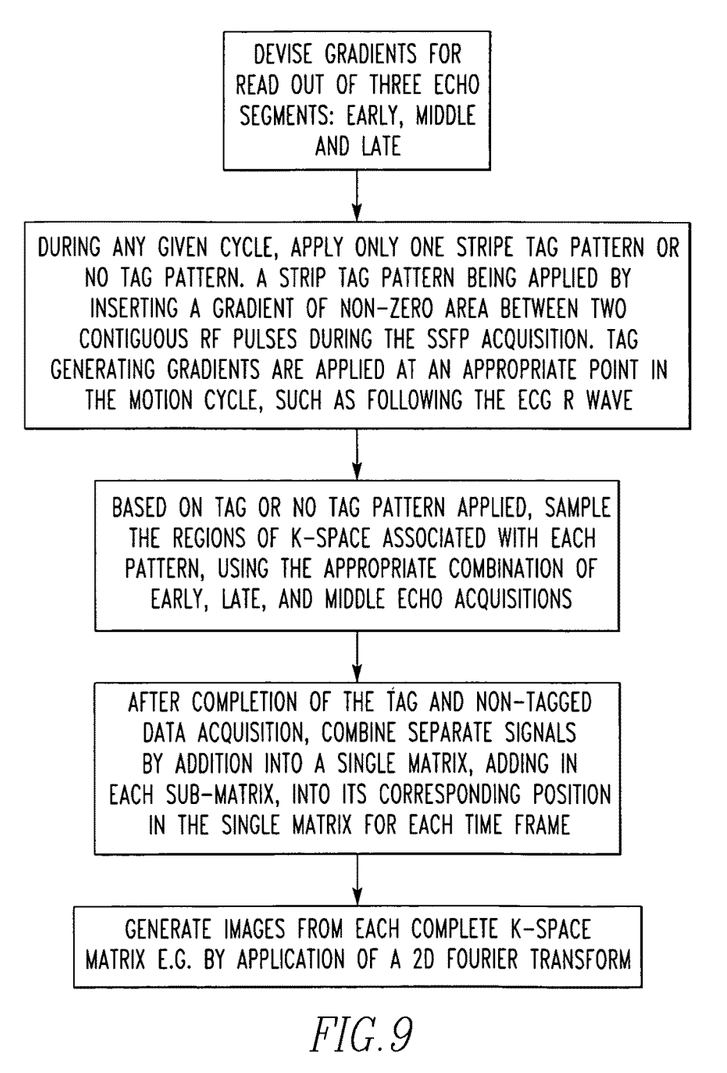
FIG. 9 is a block diagram of the manner of applying the PRESSTO tag imaging sequence.

FIG. 9 is a block diagram of the manner of applying the PRESSTO tag imaging sequence. The PRESSTO scheme is implemented on a magnetic resonance imaging scanner.

Figure 10:
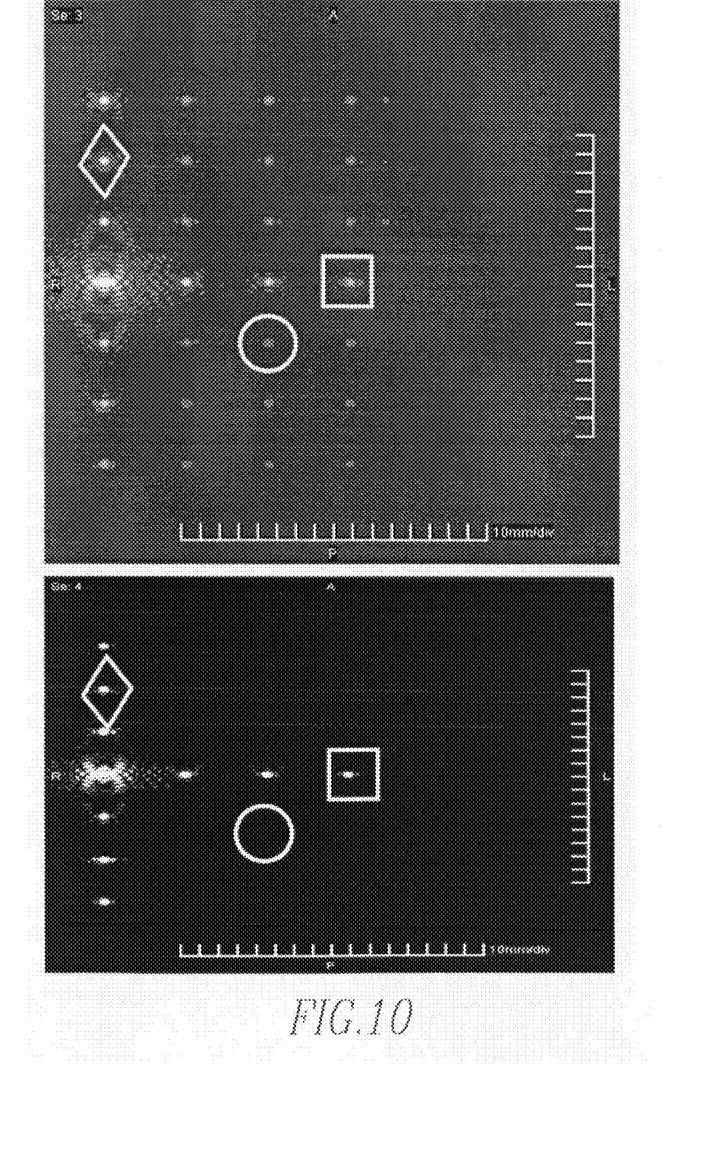
FIG. 10 shows k-space features of conventional gradient echo based tagging for conventional approach (upper panel) and the Common k-space approach (lower panel).

FIG. 10 shows k-space features of conventional gradient echo based tagging for conventional approach (upper panel) and the Common k-space approach (lower panel). The Common k-space approach has similarities to PRESSTO. In the conventional k-space representation, interfering cross-terms are generated (circle) but are absent in the Common k-space data. Representative primary tag signals responsible for generation of horizontal stripes (square) and vertical stripes (diamond) are indicated in each set.

Figure 11:
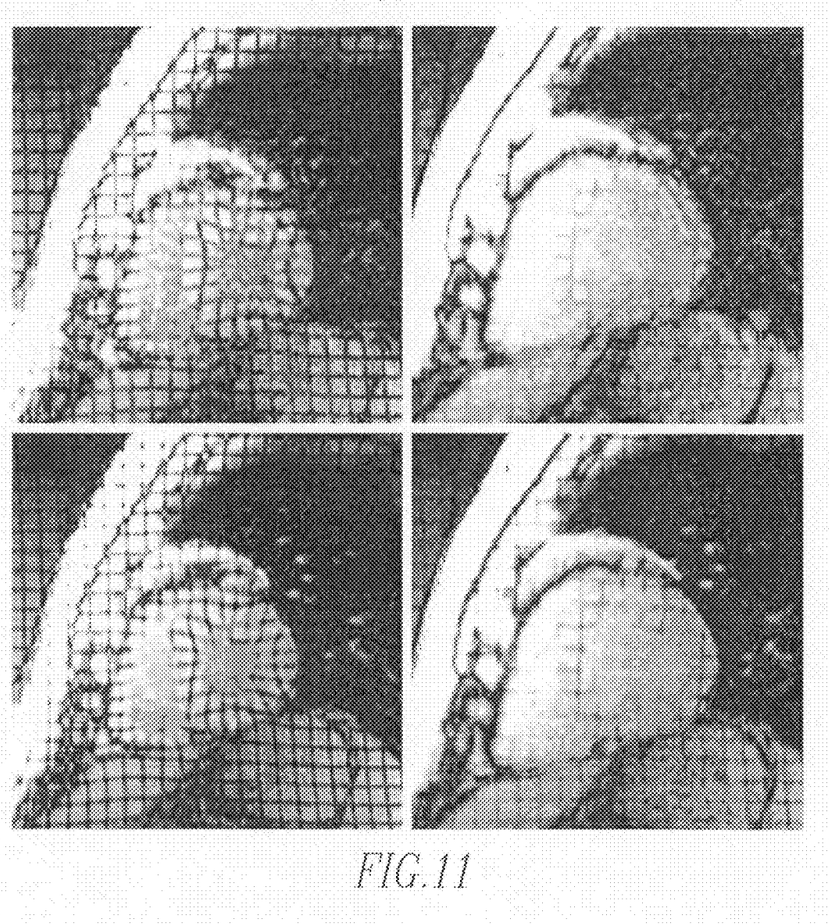
FIG. 11 shows image features of conventional gradient echo based tagging for conventional approach (upper panel) and the Common k-space approach (lower panel).

FIG. 11 shows image features of conventional gradient echo based tagging for conventional approach (upper panel) and the Common k-space approach (lower panel). Left frames are end-systolic images and right frames are end-diastolic images. Note in the conventional images the low contrast to noise ratio (CNR) and more rapid tag fade (especially in the end-diastolic frame). Note in the Common k-space images, the sharper lines defining the grid tags, and the high contrast of grid tags at end diastole.

With reference to FIG. 9, the mode of operation of the PRESSTO is described here. Using a Magnetic Resonance Imaging (MRI) scanner, perform a steady-state-free-precession (SSFP) imaging sequence. The SSFP imaging sequence is triggered to the ECG r wave, such that data for the series of k-space data sets are acquired in a manner that is time resolved through the cardiac cycle, with data acquired over a number of consecutive cardiac cycles. In PRESSTO, during each cardiac cycle, one of three patterns are applied immediately following detection of the ECG trigger, each accomplishing a different mode of preparation of the MRI signal. The three signal preparation options are: 1) apply a series of stripes along one axis (e.g. 45 degrees to the main axes), 2) apply a series of stripes along the orthogonal axis (e.g. −45 degrees to main axes), or 3) no tag pattern is applied, i.e. a "null" pattern. The stripe tag pattern is applied by replacing the "read" and "phase encode" imaging gradients of the SSFP imaging sequence for one repetition period (TR interval) by a gradient waveform with a non-zero area. The direction of the gradient is applied perpendicular to the required tag stripe direction. Applying the gradient with a non-zero area causes the spins of the body to periodically experience a cyclic phase shift perpendicular to the direction of the gradient. At the time of applying the next RF pulse of the regular SSFP sequence this periodic phase shift results in only spins close to the in-phase conditions with the RF contributing to subsequent signals. Thus, only spins in a series of parallel lines (i.e. a stripe tag pattern) will contribute to the cardiac cycle immediately following application of the stripe tag pattern. When no stripe tag pattern is to be applied, the gradient is applied with the area balanced to zero, such that all spins in the imaged plane contribute to the SSFP signal.

In PRESSTO, during any given cardiac cycle, only one of the three signal preparation patterns is applied. Each of the three signal preparation patterns primarily produces signal in distinct, and predictable, regions of k-space. Each stripe tag pattern produces data primarily in two diagonally opposing quadrants of k-space, while the non-tag pattern produces data primarily centered on the center of k-space. In PRESSTO, these regions of k-space are targeted for efficient collection of data by focusing collection on the specific region where data are concentrated. In PRESSTO, only partial lines of k-space are read out during each TR period, and by this time saving approach, a second partial k-space line segment can be read out during the same TR period. This aspect makes PRESSTO time efficient, since up to two partial k-space lines are acquired per TR period. Depending on which region of k-space is to be acquired (in combination with the signal preparation procedure), the gradients required for signal readout and phase encoding are adjusted accordingly. Thus, during each cardiac cycle, a gradient waveform is applied, which might be distinctly different from the waveform applied during other cardiac cycles. This should have no detrimental effect on the SSFP signal, since all imaging gradients balance to zero during each TR period, ensuring maintenance of the SSFP signal. Three separate regions of k-space are sampled and are referred to as "early", "late", and "middle". These terms are in reference to a conventional complete line of k-space. The "early" and "late" segments are symmetric about the center of k-space, and occupy approximately 40% of a full k-space line, they correspond to the k-space sections extending from the outer k-space edge towards the echo peak and following after the echo peak to the opposite outer k-space edge, respectively. The "middle" section corresponds to an approximately 40% section of a k-space line symmetrically centered on the echo peak.

The three targeted regions of k-space acquired in PRESSTO provide almost complete coverage of the rectangular k-space matrix, with some regions acquired in an overlapping manner while some regions do not have any data acquired. In PRESSTO this is accommodated by initially setting all k-space points to zero, and sequentially adding in data for each k-space region acquired using a summing operation (i.e. where points overlap, the data are summed, where data are acquired only once, the summing operation adds the data with the initialized zero values, and where data are not acquired, the value remains at zero). After assembling a series of k-space data sets in this manner, images are generated by the conventional step of performing a Fourier transform and associated data organization for each k-space set, time resolved throughout the cardiac cycle.

The Common k-space tagging approach has some features that are shared with PRESSTO. In FIG. 10 the k-space patterns for conventional vs. Common k-space tagging are shown. In this instance, the tag lines correspond to a set of vertical and horizontal stripes. In the conventional data set, clear cross-terms are seen that detract from the signal in the primary regions of k-space. In the corresponding cardiac images in FIG. 11, an end systolic and end diastolic frame are shown for conventional and Common k-space approaches. It is evident that in the Common k-space images, tag CNR is superior to the conventional images at end systole and especially at end diastole.

In the example of applying PRESSTO given here, a diagonal diamond tag pattern has been used. It is possible to apply other patterns, such as vertical and horizontal tags (box-grid tags) or introduce additional tags stripe directions to produce additional shapes. As presented, each component of the tag pattern is applied separately, and PRESSTO is used to acquire the regions with the dominant signal contribution. If three sets of stripes were applied, the scan time would increase to beyond that of a conventional scan (all other parameters remaining constant).

As discussed above, there are elements of PRESSTO that have appeared in previous technologies. There are two unique features, it is believed not previously used in any technology and these are 1) the manner of applying the tag stripe pattern without disrupting the regular SSFP application of RF pulses, and 2) the aspect of targeting the central region of k-space without any tags applied. The other aspects of PRESSTO, such as partial echo read out, and only applying one set of tag stripe patterns per cycle, have previously been used in Common k-space and FastHARP, but these two approaches exclusively employed variants on the gradient recalled echo (GRE) imaging sequence, whereas PRESSTO employs the SSFP imaging sequence.

The main advantages offered by PRESSTO compared to GRE approaches are that a higher SNR is achieved in PRESSTO due to use of the SSFP imaging sequence. Compare to existing tagging approaches using SSFP, PRESSTO introduces the tags in a manner that does not disrupt the regular train of RF pulsed used in SSFP imaging. This has the advantage that no addition artifacts are generated while the signal re-establishes the steady-state. Compared to the Fast-HARP approach of acquiring targeted regions of k-space, PRESSTO has the advantage that by acquiring multiple signal satellites, that tags are better defined.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. A method for forming images of a patient, the method comprising:
    detecting an ECG r wave of a cardiac cycle of the patient;
    applying a plurality of distinct signal patterns with imaging gradients to the patient immediately following detection of the ECG r wave, wherein applying the plurality of distinct signal patterns comprises:
        splitting each line of k-space data obtained from the detected ECG r wave into a plurality of segments,
        applying a first striped tag pattern along a first axis at a first segment of the plurality of segments, and
        applying a second striped tag pattern along a second axis orthogonal to the first axis at a second segment of the plurality of segments, wherein the first and second segments are selected such that no interference occurs between the plurality of distinct signal patterns that would degrade the patterns;
    triggering a steady-state free precision imaging sequence to the ECG r wave; and
    performing the steady-state free precision imaging sequence with imaging coils of a magnetic resonance imaging scanner such that data for a series of k-space data sets associated with the imaging sequence are acquired in a manner that is time resolved through the cardiac cycle, with data acquired over a number of consecutive cardiac cycles.

2. The method of claim 1 wherein applying at least one of a plurality of distinct signal patterns further comprises applying a "no tag" pattern.

3. The method of claim 1 wherein applying a first striped tag pattern includes applying a gradient waveform with a non-zero area of the steady-state free precision imaging sequence.

4. The method of claim 3 wherein applying a gradient waveform includes applying the gradient waveform perpendicular to a direction of the first striped tag pattern.

5. The method of claim 2 wherein applying the "no tag" pattern includes applying a gradient waveform with an area balanced to zero.

6. The method of claim 2 wherein applying the first striped tag pattern, applying the second striped tag pattern and applying the "no tag" pattern each produces signals in distinct regions of k-space.

7. The method of claim 6 wherein the first and second striped tag patterns produce data primarily in two diagonally opposing quadrants of k-space, and wherein the "no tag" pattern produces data primarily centered on a center of K-space.

8. The method of claim 7, further including sampling three separate regions of k-space with the imaging coils.

9. The method of claim 8, further including:
    initially setting all k-space points to a value of zero; and
    sequentially adding in data for each k-space region acquired using a summing operation.

10. The method of claim 9, wherein sequentially adding in data for each k-space region comprises:
    summing data where points of the region overlap;
    summing data from a value of zero where points do not overlap; and
    maintaining a k-space point at a value of zero where no data is acquired.

11. The method of claim 1 wherein applying a second striped tag pattern includes applying a gradient waveform with a non-zero area of the steady-state free precision imaging sequence.

12. The method of claim 11 wherein applying a second gradient waveform includes applying the gradient waveform perpendicular to a direction of the second striped tag pattern.

* * * * *